Nov. 7, 1967

F. I. JOHNSON 3,351,781

COUNTER CIRCUIT

Filed March 19, 1965

INVENTOR.
FLOYD I. JOHNSON
BY William H. Meagher
Attorney 3,351,781

COUNTER CIRCUIT

Floyd Irvin Johnson, Philadelphia, Pa., assignor to Radio Corporation of America, a corporation of Delaware Filed Mar. 19, 1965, Ser. No. 441,253
6 Claims. (Cl. 307—88.5)

ABSTRACT OF THE DISCLOSURE

A pair of transistors are intercoupled, and fed with input pulses via respective steering diodes, to establish capability for bistable multivibrator action. One of the couplings between the multivibrator transistors includes a third transistor serving as an emitter-follower in the coupling path, and controlling, via its collector, a ramp generator. The biasing of one of the steering diodes is controlled in response to the ramp generator output. An initial input pulse alters the multivibrator state, and initiates the generation of a ramp voltage that biases off the controlled steering diode; the next input pulse reverses the multivibrator state and initiates generation of a return ramp voltage at a slower rate. Steering diode remains biased off to prevent change of multivibrator state for a selected number of succeeding input pulses, as determined by ratio of ramp rates.

Figure 1:
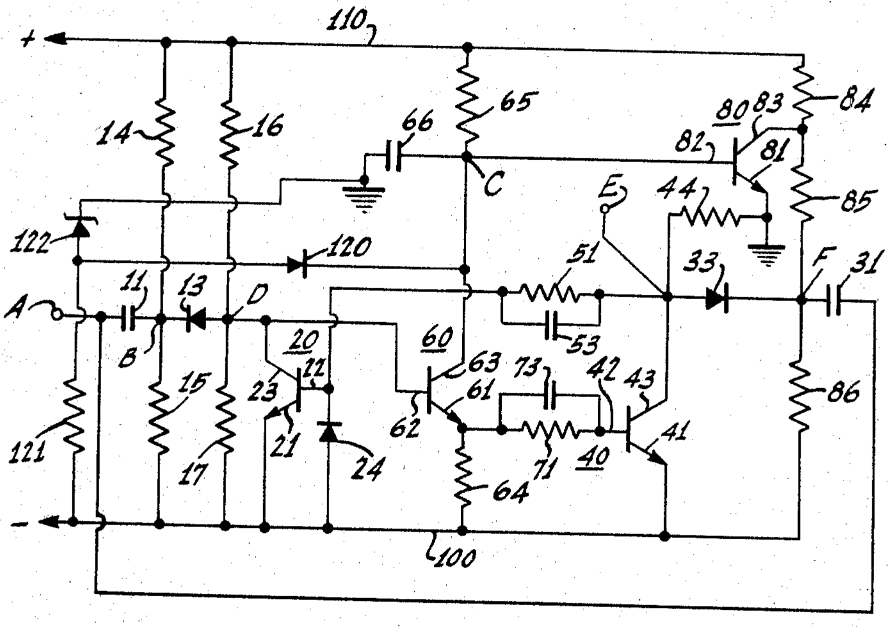

This invention relates generally to counter circuits, and particularly to counter circuits of a type advantageous for use in performing frequency dividing functions in a television synchronizing signal generator.

In the copending application of Robert A. Dischert, Ser. No. 357,026 filed Apr. 3, 1964, a pulse counter circuit of highly stable form is disclosed, and uses for such counter circuits in performing the frequency divider functions of a television sync signal generator are detailed. Counter circuits of the form disclosed by Dischert maintain a desired count in the face of input frequency variations, component value changes and other effects.

The present invention is directed to a modification of the Dischert-type counter circuits; the modification contemplated by the present invention serves to enhance the counter circuit stability in operations requiring high input frequencies (e.g., 3.58 megacycles). In particular, it is desired to retain many of the Dischert-circuit stability features under high input frequency conditions when the input triggering period is necessarily extremely short.

In a television signal conforming, for example, to the United States monochrome broadcast signal standards established by the FCC, synchronizing pulses at both the field frequency (60 cycles per second) and the line frequency (15,750 cycles per second) must be present. To assure achievement of line interlace, a particular phase relationship between the pulse trains of field and line frequencies must be maintained. Appropriate to these goals, a widely used approach to the generation of the field and line frequency synchronizing pulses involves use of an oscillator operating at twice the line frequency (i.e., 31.5 kc.); the output of this "master" oscillator is (a) frequency divided by a factor of two in effecting development of the line frequency synchronizing pulses, and (b) is frequency divided by a factor of 525 in effecting development of the field frequency synchronizing pulses. In the Dischert application, a chain of cascaded counter circuits (performing successive frequency divisions of 3, 7, 5 and 5, respectively) is suggested for performing the latter frequency divider function.

In color television sync signal generators, a further complication is encountered. In a television signal conforming to the U.S. color broadcast signal standards established by the FCC, use is made of a color subcarrier wave of a 3.579545 megacycles. The line and field frequency deflection synchronizing signals must be referenced to this subcarrier wave, the line frequency signal being 2/455 times the subcarrier frequency, while the field frequency signal must bear the usual relationship of 2/525 times the line frequency. This results in field and line frequencies that differ slightly from the monochrome field and line frequencies (approximately 59.94 and 15,734 c.p.s., respectively).

In order to assure proper locking of the deflection frequencies to the subscriber, a desirable method is to divide the output of a subcarrier wave source (usually a highly stable source, such as a temperature-controlled crystal oscillator) by a factor of 455, and to use the 7.867 kc. reference obtained by this division to lock a "master" oscillator of 31.468 kc. operating frequency (twice the color line frequency of 15,734 c.p.s.) by means of an automatic phase and frequency control system. The 31.468 kc. master oscillator is then used in conjunction with frequency dividers, as in the previously described monochrome example, to derive the line and field frequency deflection sync signals.

The division of the subcarrier frequency by a factor of 455 can be accomplished by cascading three counter stages, providing successive frequency division of 7, 5 and 13. It will be noted that in such a case, the input frequencies for the respective counter stages are 3.579545 megacycles, 511,363.5 c.p.s. and 102,272.7 c.p.s. The input frequencies thus range from 3.2 times the highest input frequency required in the monochrome example up to more than 113 times said highest frequency in the monochrome example.

It has been found that certain modifications of the counter circuits disclosed in the aforesaid Dischert application will enhance its performance capabilities under the combined conditions of high input frequency and high count impressed upon the respective counter stages in the above-described color subcarrier locking arrangement. In general, the modifications contemplated by the present invention provide greater efficiency in the utilization of the energy in the counter input triggers. This provision of greater efficiency in triggering utilization is achieved without detracting from such desirable characteristics as insensitivity to input frequency variations and to timing capacitor value changes.

In accordance with an embodiment of the present invention, a pair of transistors are disposed in a multivibrator configuration, with one of the coupling paths between the multivibrator transistors incorporating a third transistor serving as an emitter follower in one cross coupling between multivibrator transistors. The third transistor also functions, in conjunction with a capacitor connected to its collector electrode as a ramp generator. A pair of input trigger paths are provided, each incorporating a "steering" diode connected to the base electrode of a respectively different one of the multivibrator transistors. A fourth transistor, responsive to the charge on the capacitor of the ramp generator, controls the biasing of one of the steering diodes.

An operating cycle involves the following steps. A first input trigger alters the multivibrator state, turning one multivibrator transistor on and the other multivibrator transistor off, and, in the process, rendering the ramp generator transistor conductive, initiating the development of a negative-going ramp. The diode bias controlling transistor, responding to the resultant change in charge on the ramp capacitor, is cut off, thereby biasing off the steering diode that it controls. The next successive input trigger cannot pass through the blocked steering diode, but does pass through the other steering diode, and alters the multivibrator state, returning it to the condition prevailing before the first named input trigger, and, in the process, cutting off the ramp generator transistor. Cut-off of the latter transistor ceases the development of the negative-going ramp, and allows the initiation of a positive-going ramp of a selected time constant.

Until the positive-going ramp reaches a level permitting the return to conduction of the diode bias controlling transistor, the counter thereafter "ignores" successive input triggers; this "ignoring" of input triggers is due to the fact that both steering diodes are blocked. After a predetermined number of input triggers have been "ignored," the positive going ramp reaches a level permitting conduction in the diode bias controlling transistor, and the steering diode that it controls becomes unblocked. The counter circuit is now in the starting condition, and the input trigger next succeeding the unblocking of the steering diode will re-initiate the above-described operating cycle.

The value of the count provided by the above-described circuit is set by the relative component choices for the ramp capacitor charging and discharging circuits. With selection of this relationship determining the count, such count will be maintained despite wide variations in input frequency, it being noted that the period of capacitor charge alteration in one direction is directly determined by the input frequency. As this period varies with change in input frequency, a compensating change in the period of charge alteration in the opposite direction is inherently provided, whereby count maintenance is insured. It may be readily demonstrated that the same automatic compensation holds true for significant changes in the value of the ramp capacitor, whereby the need for precision timing capacitors is obviated.

The feature of insenitivity in input frequency variations renders counter circuits of the present invention highly desirable for use in multiple standard sync signal generating equipment; i.e., the same counter circuit may be used to provide the same count in frequency division apparatus which has its input frequency selectively altered to conform to more than one set of broadcast signal standards, where the respective standards differ in, for example, color subcarrier frequency and/or deflection line and field frequencies.

A primary object of the present invention is to provide a stable counter circuit suitable for performing frequency divider functions in such apparatus as color television sync signal generators.

A further object of the present invention is to provide a counter circuit which maintains a desired count in the face of significant input frequency variations or capacitor value changes under high input frequency operating conditions, such as may be encountered in those frequency dividing functions of a color television sync signal generator that are associated with the locking of deflection signal frequencies to a color subcarrier frequency.

Figure 2:
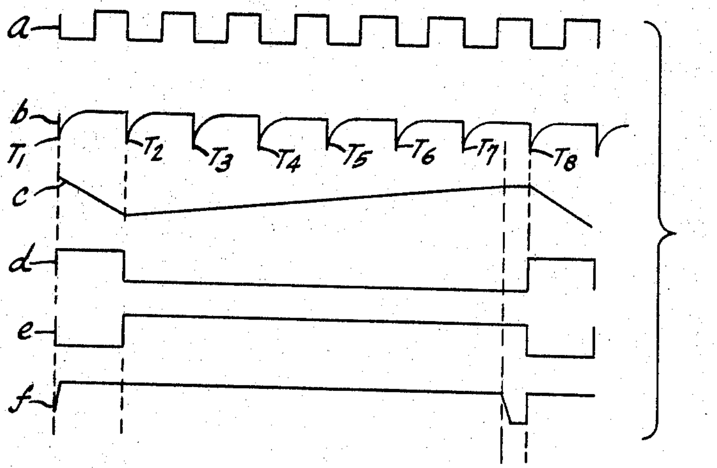

Other objects and advantages of the present invention will be readily recognized by those skilled in the art upon a reading of the following detailed description and an inspection of the accompanying drawing in which:

FIGURE 1 illustrates schematically a counter circuit embodying the principles of the present invention; and FIGURE 2 graphically illustrates voltage waveforms associated with the operation of the counter circuit embodiment of FIGURE 1.

In FIGURE 1, the input to the illustrated counter circuit appears at terminal A, the input comprising a series of regularly recurring, negative-going voltage pulses. The input pulses at terminal A are coupled to the counter circuit via two paths: (1) a first path, comprising a coupling capacitor 11 in series with a first steering diode 13, the anode of which is directly connected to the collector 23 of a first transistor 20; and (2) a second path, comprising a second coupling capacitor 31 in series with a second diode 33, the anode of which is directly connected to the collector 43 of a second transistor 40.

The collector 43 of transistor 40 is coupled to the base 22 of transistor 20 by a time constant network comprising the parallel combination of resistor 51 and a capacitor 53. The collector 23 of transistor 20 is coupled to the base 42 of transistor 40 by means including a second time constant network comprising the parallel combination of a resistor 71 and a capacitor 73. In contrast with the first-described collector-to-base coupling, the collector 23 is not directly connected to one terminus of the parallel RC network 71, 73, but rather is connected thereto via the base-emitter diode of a third transistor 60, which functions as an emitter follower in the coupling of signals from collector 23 to base 42.

As described thus far, is will be seen that transistors 20 and 40 are intercoupled in what would normally comprise a bistable multivibrator configuration. To appreciate why the circuit departs from the normal operation of a bistable multivibrator, it is in order to now consider an additional function served by the emitter-follower transistor 60. The emitter-collector circuit of transistor 60 comprises an emitter resistor 64 connected between the emitter 61 of transistor 60 and a negative voltage supply bus 100, and a collector resistor 65 connected between the collector 63 of transistors 60 and a positive voltage supply bus 110. A capacitor 66 is connected between collector 63 and a point of reference or ground potential. The elements 65 and 66, in cooperation with the transistor 60, form a ramp voltage waveform generator.

A fourth transistor 80 is rendered responsive to the ramp generator output. The base 82 of transistor 80 is directly connected to the collector 63 of transistor 60; the emitter 81 of the transistor 80 is grounded, while the collector 83 is connected via collector resistor 84 to the positive voltage supply bus 110.

A biasing network for steering diode 33 is provided by a voltage divider comprising the series combination of resistors 85 and 86, the series combination being connected between the collector 83 of transistor 80 and the negative voltage supply bus 100, with the junction (F) of steering diode 33 and coupling capacitor 31 directly connected to the junction of voltage divider resistors 85 and 86. The effect of the ramp generator and its control of the bias of steering diode 33 via transistor 80 will be subsequently described, after completion of the detailing of the circuit connections of the illustrated counter circuit.

A collector resistor for transistor 40 is provided by resistor 44, connected between the collector 43 and a point of ground potential: the emitter 41 of transistor 40 is directly connected to the negative voltage supply bus 100.

A biasing network for steering diode 13 is provided by a voltage divider comprising the series combination of resistors 14 and 15, with the series combination connected between the positive and negative voltage supply buses 110 and 100, and with the junction (B) of the series resistors 14 and 15 directly connected to the junction of coupling capacitor 11 and steering diode 13. A second voltage divider is formed by the series combination of resistors 16 and 17, also connected between the respective voltage supply buses 110 and 100; the junction (D) of voltage divider resistors 16 and 17 is directly connected to the junction of steering diode 13 and collector 23 of transistor 20. The emitter 21 of transistor 20 is directly connected to the negative voltage supply bus 100; a diode 24 is directly connected between the base 22 of transistor 20 and the negative bus 100, with the diode poled oppositely to the poling of the base-emitter diode of transistor 20 which it directly shunts.

The collector 63 of transistor 60 is connected via a diode 120 to the junction of a resistor 121 and a zener diode 122, the latter being connected in series, in the order named, between the negative bus 100 and a point of ground potential. The network comprising elements 120, 121 and 122 performs a "collector-catching" function to be subsequently described.

In explanation of an operating cycle of the illustrated counter circuit, an initial state is assumed in which transistors 20 and 80 are conducting, and transistors 60 and 40 are nonconducting. A negative input trigger, produced by differentiation of a negative input pulse (by elements 31, 85 and 86) and corresponding in time with the negative-going leading edge of the input pulse, is passed by steering diode 33, driving transistor 20 off, which, in turn, renders transistors 60 and 40 conducting, due to the basic multivibrator relationship of transistors 40 and 20. Conduction by transistor 60 commences the development of a negative-going ramp voltage waveform across capacitor 66 (i.e., at collector 63); the negative going ramp voltage turns transistor 80 off. With transistor 80 nonconducting, the bias voltage at the junction of resistors 85 and 86 rises in a positive direction to block steering diode 33.

Until the production of the next input trigger, the circuit stabilizes in its altered operating condition. Transistor 60 continues in conduction, with the potential at its collector 63 substantially linearly changing in a negative direction in development of the negative-going ramp that biases transistor 80 off, blocking conduction by steering diode 33. The transistor 40 also continues to conduct, holding the transistor 20 off.

When the leading edge of the next input pulse occurs, the input trigger developed at the cathode of diode 33 is sufficient to unblock the steering diode 33. However, a negative-going input trigger, produced by differentiation at the cathode of steering diode 13 is passed by that steering diode to the base 62 of transistor 60 (and via emitter-follower action) to the base 42 of transistor 40, turning these transistors off. The positive-going transition at collector 43 is coupled via network 51, 53 to the base 22 of transistor 20, driving transistor 20 into conduction, and rendering diode 24 nonconductive. The "multivibrator" transistors are thus returned to their initial condition; the conduction of transistor 20 holding transistors 60 and 40 off.

The negative-going change in the charge of capacitor 66 ceases with the turn-off of transistor 60, and the charge of capacitor 66 begins an alternation in a positive-going direction, with the rate of change being determined by the time constant of resistor 65 and capacitor 66. The count produced by the illustrated circuit will be determined by the ratio of this constant to that associated with the negative-going ramp generation (i.e., the time constant of capacitor 66, resistor 64 and conducting transistor 60). For a count of N (greater than two) this ratio is chosen to be substantially equal to N minus one and one-half; i.e., $t_2$ substantially equals $t_1$ (N–1.5), where $t_2$ is the time constant of resistor 65 and capacitor 66, and $t_1$ is the time constant of capacitor 66, resistor 64 and conducting transistor 60. The time constant for the ensuing positive ramp generation is thus appropriately longer than the time constant associated with the negative-going ramp generation, whereby the potential at collector 63 will not rise to its starting level unil some predetermined number of successive input pulse intervals have occurred.

Thus, a complete return to starting conditions is not obtained when transistor 20 is rendered conductive, since transistor 80 remains off, with the further result that steering diode 33 remains blocked. The departure from normal "multivibrator" operation (i.e., whereby normal "multivibrator" operation is controllably arrested to a degree related to the desired count) that accompanies this effect is illustrated by what occurs when the next input pulse leading edge arrives. The input trigger appearing at the cathode of diode 33 cannot pass through the blocked diode 33. The diode 13 is also reverse biased due to the conducting state of transistor 20; moreover, even if the input trigger produced at the cathode of diode 13 were sufficiently large to overcome the reverse bias on diode 13, it could not alter the state of the "multivibrator" circuit, since it would only tend to drive further off the already nonconducting transistor 60. Accordingly, the third input trigger is thus "ignored" by the counter circuit, and some predetermined number of its successors will likewise be "ignored" as the slowly rising potential at collector 63 remains below the level necessary for conduction in transistor 80. With proper choice of time constants, arrival of the ramp voltage at the starting level (at which transistor 80 will recommence conduction) occurs midway between successive input trigger occurrences. When this starting level is reached, transistor 80 goes into conduction, altering the bias on the cathode of diode 33 in a negative direction to unblock this diode. Conduction through the base-emitter diode of transistor 80 holds the potential at collector 63 at a substantially fixed level. When the next succeeding input pulse leading edge occurs, the operating cycle is recommenced, with an input trigger passing through the now unblocked diode 33 to drive the transistor 20 into nonconduction.

In FIGURE 2, voltage waveforms at various points of interest in the above-described counter circuit are shown, covering a time period encompassing slightly more than one operating cycle. Waveform *a* is illustrative of the train of input pulses appearing at terminal A. Waveform *b* is illustrative of the train of negative-going input triggers produced, for example, at the cathode of the steering diode 13 (i.e., at terminal B). Waveform *c* is illustrative of the ramp waveforms developed at collector 63 (terminal C) of transistor 60 (i.e., the substantially sawtooth waveform developed across capacitor 66).

Waveform *d* is illustrative of the voltage wave developed at the collector 23 (terminal D) of transistor 20. Waveform *e* is illustrative of the negative-going pulse waveform developed at the collector 43 (terminal E) of the transistor 40. The latter waveform is suitable for serving as the counter circuit output waveform, for application, for example, to a succeeding frequency divider stage of the illustrated counter circuit form. Waveform *f* is illustrative of a component of the voltage waveform that is developed at the cathode of diode 33 (i.e., at terminal F) due to the action of transistor 80. The actual waveform appearing at this point is a composite waveform corresponding to a summation of this waveform *f* and an input trigger train such as shown by waveform *b*.

The set of waveforms shown in FIGURE 2 are illustrative of the conditions prevailing where the count choice is seven. Thus, an initial input trigger $T_1$ is seen to initiate the turnoff of transistor 20 (note the positive-going leading edge of positive pulse in waveform *d*), the turn-on of transistor 40 (note the negative-going leading edge of the negative output pulse of waveform *e*), the negative-going ramp across capacitor 66 (waveform *c*) and the blocking of steering diode 33 (note the positive-going rise in waveform *f*). The next succeeding input trigger $T_2$ initiates the return to conduction of transistor 20 (note the termination of the positive pulse of waveform *d*), the return to nonconduction of transistor 40 (note the positive-going trailing edge of the negative output pulse of waveform *e*), and the end of the negative-going ramp and the beginning of the positive-going ramp of the sawtooth developed across capacitor 66 (waveform *c*).

As the waveforms illustrate, the next succeeding five input triggers $T_3$, $T_4$, $T_5$, $T_6$ and $T_7$ are "ignored" by the counter circuit, with no change in waveforms *d* and *e*, and with no disturbances of the positive-going ramp generation of waveform *c*. At a time midway between the seventh input trigger $T_7$ and the next succeeding input trigger $T_8$, the positive ramp variation ends with conduction by transistor 80, resulting in a leveling off of waveform *c* at the starting level; the return of diode 33 to an unblocked condition is indicated by the resulting negative-going transition in waveform *f*. With the appearance of the eighth input trigger $T_8$, the operating cycle recommences.

As previously noted, the network 120-121-122 performs a collector-catching function, a function providing to ensure reliable starting upon the application of supply voltages. In the absence of this network it would be possible, upon turn-on of supply voltages, to have the circuit settle in a state with transistors 20 and 80 off and transistors 60 and 40 in saturation. If transistor 60 were in saturation, a normal input trigger passing through diode 13 might not be capable of triggering the circuit out of this starting state. The network 120-121-122 precludes this undersired condition by preventing transistor 60 from reaching saturation. At turn-on an approach to saturation by transistor 60 will be halted by conduction of diode 120 to reference collector 63 to an appropriate fixed voltage level established across the zener diode 122 element of the voltage divider 121-122.

As previously discussed, a contemplated use for circuitry such as shown in FIGURE 1 is service in performing frequency dividing functions in a color television sync signal generator. In a practical example of such use, frequency division from the color subcarrier frequency of 3.579545 mc. to a frequency of 7.687 kc. (half the color line frequency of 15.734 kc.) has been accurately and stably achieved using three cascaded counter stages of the FIGURE 1 form, with emitter-follower buffers between successive stages, and with the circuit constants of the respective stages selected to provide successive counts of 7, 5 and 13.

Ability to accurately frequency divide at such high input frequencies (with the consequent narrow triggering intervals) as are involved in the example above has been enhanced in the modified circuit of the present invention through the use of emitter-follower stage 60 in ramp generation and trigger coupling; introduction of this stage permits operations of the transistor 40 stage in the regenerative "multivibrator" configuration without a trigger-degenerating emitter impedance (in contrast with the circuitry of the previously mentioned copending application).

Use of the diode-bias controlling transistor 80 stage improves the trigger discrimination capability of the counter circuit whereby counts of such high order as 13 can be reliably obtained. That is, the ability of the counter to "ignore" (for example) the eleventh input trigger following the initiation of positive ramp generation, and yet not "ignore," but rather respond to, the twelfth such trigger, is enhanced by the interposition of transistor 80 in the diode bias control arrangement; an incremental change in ramp level that is small relative to input trigger amplitude can be relied upon to alter diode 33 from a trigger blocking state to the trigger passing state that reinitiates the counting cycle.

It may be noted that whereas the FIGURE 1 circuit shares with the basic circuit configuration of the aforementioned copending Dischert application a significant immunity to adverse effects on count maintenance from input frequency variations or capacitor value changes, the FIGURE 1 circuit as illustrated does not possess immunity to supply voltage changes. Where the voltage levels on supply buses 110 and 100 are accurately maintained, the absence of this immunity is not significant. Such immunity can, however, be obtained by a simple modification of the illustrated configuration involving return of emitter 81 and resistor 44, not to a point of ground potential, but rather to a corresponding point on a resistive voltage divider connected between the buses 110 and 100.

By way of specific example, a table of values and types for the circuit constants of FIGURE 1 is presented below; these represent a set of operating parameters found to be appropriate in dividing a 3.579545 mc. input by a factor of seven:

| | | |
|---|---|---|
| Capacitor 11 | $\mu\mu$f | 30 |
| Capacitor 31 | $\mu\mu$f | 47 |
| Capacitor 53 | $\mu\mu$f | 22 |
| Capacitor 66 | $\mu\mu$f | 360 |
| Capacitor 73 | $\mu\mu$f | 27 |
| Resistor 14 | ohms | 16,000 |
| Resistor 15 | do | 6,200 |
| Resistor 16 | do | 4,320 |
| Resistor 17 | do | 1,870 |
| Resistor 44 | do | 2,200 |
| Resistor 51 | do | 20,000 |
| Resistor 64 | do | 1,000 |
| Resistor 65 | do | 13,300 |
| Resistor 71 | do | 10,000 |
| Resistor 84 | do | 1,500 |
| Resistor 85 | do | 2,000 |
| Resistor 86 | do | 12,000 |
| Resistor 121 | do | 1,800 |
| Transistors 20, 40, 60, 80 | | 2N708 |
| Diodes 13, 24, 33, 120 | | IN3067 |
| Zener diode 122 | | IN703A |
| Bus 110 | volts | +11 |
| Bus 100 | do | −11 |

What is claimed is:

1. A counter circuit for use with a source of input impulses comprising the combination of:
first and second transistors, each provided with respective base, emitter and collector electrodes;
means for interconnecting said first and second transistors to establish capability for regenerative multivibrator action, said interconnecting means including means providing a signal path between the collector electrode of said second transistor and the base electrode of said first transistor;
a third transistor having base, emitter and collector electrodes, said interconnecting means further including means establishing a signal path between the collector electrode of said first transistor and the base electrode of said second transistor, said last-named signal path including the base-emitter diode of said third transistor;
a capacitor;
means, including a coupling between the collector electrode of said third transistor and said capacitor, for developing at a first rate and in a first direction a ramp variation in voltage across said capacitor when said third transistor is conducting, and for developing at a second rate a ramp variation in said voltage in a direction opposite to said first direction when said third transistor is rendered nonconducting;
means for applying said input impulses with a conduction-inhibiting polarity to the base electrode of said third transistor;
means, inclusive of a diode, for establishing a path for application of said input impulses with a conduction-inhibiting polarity to the base electrode of said first transistor;
and means for controllably biasing said diode in response to the level of voltage across said capacitor.

2. A counter circuit for use with a source of input impulses comprising the combination of:
first and second transistors, each provided with respective base, emitter and collector electrodes;
means for interconnecting said first and second transistors to establish capability for regenerative multivibrator action, said interconnecting means including means providing a signal path between the collector electrode of said second transistor and the base electrode of said first transistor;
a third transistor having base, emitter and collector electrodes, said interconnecting means further including means establishing a signal path between the collector electrode of said first transistor and the base electrode of said second transistor, said last-named signal path including the base-emitter diode of said third transistor;
a capacitor;
means, including a coupling between the collector electrode of said third transistor and said capacitor, for developing at a first rate and in a first direction a ramp variation in voltage across said capacitor when said third transistor is conducting, and for developing at a second rate a ramp variation in said voltage in a direction opposite to said first direction when said third transistor is rendered nonconducting;

means for applying said input impulses with a conduction-inhibiting polarity to the base electrode of said third transistor;

means, inclusive of a diode, for establishing a path for application of said input impulses with a conduction-inhibiting polarity to the base electrode of said first transistor;

and means for controllably biasing said diode in response to the level of voltage across said capacitor;

said diode bias controlling means including a fourth transistor having base, emitter and collector electrodes, means for connecting said capacitor between said base and emitter electrodes of said fourth transistor, and means providing a direct current conductive connection between said diode and the collector electrode of said fourth transistor.

3. A counter circuit for use with a source of input impulses comprising the combination of:

first and second transistors, each provided with respective base, emitter and collector electrodes;

means for interconnecting said first and second transistors to establish capability for regenerative multivibrator action, said interconnecting means including means providing a signal path between the collector electrode of said second transistor and the base electrode of said first transistor;

a third transistor having base, emitter and collector electrodes, said interconnecting means further including means establishing a signal path between the collector electrode of said first transistor and the base electrode of said second transistor, said last-named signal path including the base-emitter diode of said third transistor;

a capacitor;

means, including a coupling between the collector electrode of said third transistor and said capacitor, for developing at a first rate and in a first direction a ramp variation in voltage across said capacitor when said third transistor is conducting, and for developing at a second rate a ramp variation in said voltage in a direction opposite to said first direction when said third transistor is rendered nonconducting;

means for applying said input impulses with a conduction-inhibiting polarity to the base electrode of said third transistor;

means for establishing a path for application of said input impulses with a conduction-inhibiting polarity to the base electrode of said first transistor, said input impulse path including a diode;

and means for alternately biasing said diode into an input impulse blocking state and an input impulse passing state in dependence upon the level of voltage across said capacitor.

4. A counter circuit for use with a source of input impulses comprising the combination of:

first and second transistors, each provided with respective base, emitter and collector electrodes;

means for interconnecting said first and second transistors to establish capability for regenerative multivibrator action, said interconnecting means including means providing a signal path between the collector electrode of said second transistor and the base electrode of said first transistor;

a third transistor having base, emitter and collector electrodes, said interconnecting means further including means establishing a signal path between the collector electrode of said first transistor and the base electrode of said second transistor, said last-named signal path including the base-emitter diode of said third transistor;

a capacitor;

means, including a coupling between the collector electrode of said third transistor and said capacitor, for developing at a first rate and in a first direction a ramp variation in voltage across said capacitor when said third transistor is conducting, and for developing at a second rate a ramp variation in said voltage in a direction opposite to said first direction when said third transistor is rendered non-conducting;

means for applying said input impulses with a conduction-inhibiting polarity to the base electrode of said third transistor;

means, inclusive of a diode, for establishing a path for application of said input impulses with a conduction-inhibiting polarity to the base electrode of said first transistor, said input impulse path including a diode;

and means for alternately biasing said diode into an input impulse blocking state and an input impulse passing state;

said diode biasing means including a fourth transistor having an input circuit responding to the voltage across said capacitor and an output circuit coupled to said diode.

5. A counter circuit comprising the combination of a pair of transistors intercoupled in such manner as to provide, unless otherwise arrested, bistable multivibrator action whereby successive input impulses cause said transistor pair to alternate between a first state where one transistor is conducting and the other is nonconducting, and a second state where said one transistor is nonconducting and said other transistor is conducting;

and means for controllably arresting said multivibrator action of said intercoupled transistor pair, said arresting means including: a ramp waveform generator comprising a third transistor coupled to said transistor pair in such manner as to match the conducting and nonconducting states of said other transistor of said pair, a diode for alternately blocking and passing input impulses to said one transistor of said pair, and means for controlling the alternation of said diode between said input impulse blocking and passing states in accordance with the output of said ramp generator.

6. A counter circuit comprising the combination of a pair of transistors intercoupled in such manner as to provide, unless otherwise arrested, bistable multivibrator action whereby successive input impulses cause said transistor pair to alternate between a first state where one transistor is conducting and the other is nonconducting, and a second state where said one transistor is nonconducting and said other transistor is conducting;

and means for controllably arresting said multivibrator action of said intercoupled transistor pair, said arresting means including: a ramp waveform generator comprising a third transistor coupled to said transistor pair in such manner as to match the conducting and nonconducting states of said other transistor of said pair, a diode for alternately blocking and passing input impulses to said one transistor of said pair, and means including a fourth transistor for controlling the alternation of said diode between said input impulse blocking and passing states in accordance with the output of said ramp generator.

References Cited

UNITED STATES PATENTS 2,866,104 12/1958 Biggam ............ 307—88.5

ARTHUR GAUSS, *Primary Examiner.*

JOHN ZAZWORSKY, *Assistant Examiner.*